United States Patent [19]

Kojima

[11] Patent Number: 4,734,267
[45] Date of Patent: Mar. 29, 1988

[54] APPARATUS FOR GROWING COMPOUND SEMICONDUCTOR SINGLE CRYSTALS

[75] Inventor: Masakatu Kojima, Yokosuka, Japan

[73] Assignee: Tokyo Shibaura Denki Kabushiki Kaisha, Kawasaki, Japan

[21] Appl. No.: 511,279

[22] Filed: Jul. 6, 1983

[30] Foreign Application Priority Data

Jul. 15, 1982 [JP] Japan .................. 57-122118

[51] Int. Cl.⁴ .................. B01D 9/00; C30B 15/22
[52] U.S. Cl. .................. 422/249; 156/607; 156/DIG. 70; 156/617.1
[58] Field of Search .......... 422/249; 156/607, 617 SP

[56] References Cited

U.S. PATENT DOCUMENTS

| | | | |
|---|---|---|---|
| 3,511,610 | 5/1970 | Dohmer | 422/249 |
| 4,330,361 | 5/1982 | Kuhnenfeld et al. | 422/249 |
| 4,330,362 | 5/1982 | Zulehner | 422/249 |
| 4,478,675 | 10/1984 | Akai | 156/605 |

FOREIGN PATENT DOCUMENTS

| | | |
|---|---|---|
| 123585 | 9/1979 | Japan ............... 156/607 |
| 1113069 | 5/1968 | United Kingdom . |
| 1388286 | 3/1975 | United Kingdom . |

OTHER PUBLICATIONS

Translation of Mitsubishi Japanese Patent 54-123585, 9/25/79.
Mullin et al., "Liquid Encapsulation Crystal Pulling at High Pressures", J. Crystal Growth 3, 4 (1968), 281-285.
Weiner et al., "Liquid Encapsulated Czochralski Growth of GaAs", J. Elecrochem. Soc., 118, 2, Feb. 1971, 301-306.
Liquid Encapsulated Czochralski Growth of 35 mm Diameter Single Crystals of GaP, by S. F. Nygren—Journal of Crystal Growth, vol. 19 (1973) pp. 21-32.
Growth of GaAs Single Crystals by Liquid Encapsulated Czochralski Technique, by R. Thyagarajan et al.—Indian Journal of Pure & Applied Physics, vol. 17, Oct. 1979, pp. 650-654.

*Primary Examiner*—John Doll
*Assistant Examiner*—Robert M. Kunemund
*Attorney, Agent, or Firm*—Finnegan, Henderson, Farabow, Garrett & Dunner

[57] ABSTRACT

An apparatus for growing compound semiconductor single crystals includes a collector which removes the excess amount of melt $B_2O_3$ from the crucible containing melt GaP and melt $B_2O_3$.

The collector moves up and down independently with reference to the shaft used in pulling the single crystals from the crucible.

5 Claims, 7 Drawing Figures

APPARATUS FOR GROWING COMPOUND SEMICONDUCTOR SINGLE CRYSTALS

BACKGROUND OF THE INVENTION

1. Field of the Invention

This invention relates to apparatus for producing single crystals and, more particularly, to apparatus employing the Liquid Encapsulated Czochralski method for producing compound semiconductor single crystals.

2. Description of the Prior Art

The Liquid Encapsulated Czochralski (LEC) method has been used for growing compound semiconductor single crystals, such as gallium phosphate (GaP), gallium arsenide (GaAs) and Indium phosphate (InP), from melt GaP, melt GaAs or melt Inp. In this method, the single crystal is grown at the surface of melt compound semiconductor material which is pressurized by inert gas, such as nitrogen (N2), and whose surface is covered by melt boron oxide ($B_2O_3$) in order to prevent decomposition and vaporization of the compound semiconductor melt. In FIG. 1 showing a cross-sectional view of a conventional apparatus for growing the single crystals used for the LEC method, a crucible 1 is protected by a support wall 2. A compound semiconductor melt 3 having high specific gravity resides in the crucible 1, and melt boron oxide ($B_2O_3$) 4 completely covers the surface of the compound semiconductor. A heater 5 melts the compound semiconductor melt material 3 and the ($B_2O_3$) 4 and keeps these two compounds in a molten condition. The heater 5 is surrounded by a heat shield 6 in order to improve the efficiency of the heater in directing heat to the crucible 1. A crucible driving shaft 7 rotates the crucible 1 to mix the compound semiconductor melt and to equalize its temperature within the crucible 1. A thermocouple 8, which is embedded in the shaft 7, measures the temperature of the compound semiconductor melt.

A single crystal 9 is grown by gradually pulling it from the semiconductor melt. To this end, a pulling shaft 11 with a seed crystal 10 at one end is lowered through melt ($B_2O_3$) 4 into contact with the surface of the compound semiconductor melt 3, to allow growth to begin, and is then gradually raised. The shaft 11 is connected to rotating and reciprocating apparatus (not shown) which drives the shaft at predetermined pulling and rotation rates. All of the elements shown in FIG. 1 are contained in a high-pressure housing 12 filled with $N_2$ gas at a pressure higher than that of the equilibrium dissociation pressure of the compound semiconductor melt 3.

It has been found that the conventional growing apparatus described above cannot completely prevent the decomposition and vaporization of the compound semiconductor melt because decomposition and vaporization of the compound semiconductor melt occurs during the melting phase of the compound semiconductor material in the growth chamber before crystal growing begins. Because polycrystalline particles with various shapes are used as crude material for the compound semiconductor melt, the particles fill the crucible 1 with interstices or spaces between them. The total volume of particles occupying the crucible 1 is about 60 percent of the volume of the crucible at best. As an example, the ratio of weight to volume of GaP polycrystalline particles filling the crucible is less than 2.5 gr/cc; however, the specific gravity of GaP itself is 4.13 gr/cc.

When the crucible 1, which contains the solid particles of compound semiconductor material and the solid $B_2O_3$, is heated, the solid $B_2O_3$ melts at about 600° C. The semiconductor particles do not melt at this temperature. The melting temperature of the particles is higher and depends on the particular material. For example, the melting temperature of GaP, GaAs and InP is 1470° C., 1237° C., and 1062° C., respectively. During heating of the crucible, both the melt $B_2O_3$ and the particles of compound semiconductor exist in the crucible at 600° C., which is the melting temperature of $B_2O_3$, to more than 1000° C.

Because of these differences in melting point, the conventional apparatus for growing single crystals cannot prevent decomposition and vaporization of the compound semiconductor. For example, if an amount of $B_2O_3$ such as a layer of melt $B_2O_3$, is used, which does not completely cover the surface of the compound semiconductor particles, the decomposition and vaporization of the compound semiconductor are not prevented when the semiconductor particles begin to melt. On the other hand, if an amount of melt $B_2O_3$ is used which completely covers the particles of the compound semiconductor, the layer of the melt $B_2O_3$ may be so thick that it causes deterioration of the temperature gradient at the surface of the melt compound semiconductor so that compound semiconductor single crystals can not grow.

This problem becomes more serious when compound semiconductors are used to grow single crystals with large diameters.

SUMMARY OF THE INVENTION

It is, therefore, an object of the present invention to provide an apparatus for growing compound semiconductor single crystals which are prevented from decomposing and vaporizing upon melting, and for controlling the amount of melt $B_2O_3$ so that the proper temperature gradient exists at the surface of the melt compound semiconductor for growing the single crystals.

Additional objects and advantages of the invention will be set forth in part in the description which follows, and in part will be obvious from the description, or may be learned by practice of the invention. The objects and advantages of the invention may be realized and attained by means of the instrumentalities and combinations particularly pointed out in the appended claims.

To achieve the objects and in accordance with the present invention as embodied and broadly described herein, there is provided an apparatus for growing compound semiconductor single crystals comprising a crucible for containing compound semiconductor melt and inert material which does not react to the compound semiconductor melt and which is of a sufficient quantity to cover the surface of the compound semiconductor melt in order to prevent the latter from decomposition and vaporization; means for heating the crucible; means for pulling single crystals from the compound semiconductor melt, said pulling means designed to have a seed crystal attached thereto to initiate crystal growth; means for collecting a portion of the inert material through movement into contact therewith to permit the single crystal growth yet not uncover the surface of the compound semiconductor melt; and a high-pressure housing in which the apparatus structural elements are contained and which is designed to be filled with inert gas under high pressure.

BRIEF DESCRIPTION OF THE DRAWINGS

The accompanying drawings, which are incorporated in and constitute a part of this specification, illustrate an embodiment of the invention and, together with the description, serves to explain the principles of the invention.

DESCRIPTION OF THE PREFERRED EMBODIMENT

Figure 1:
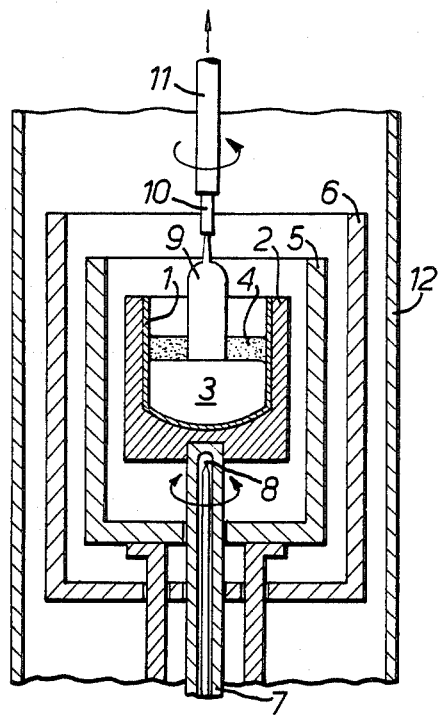
FIG. 1 shows a cross-sectional view of a main part of a conventional apparatus for growing compound semiconductor single crystals employing the Liquid Encapsulated Czochralski method.
Figure 2:
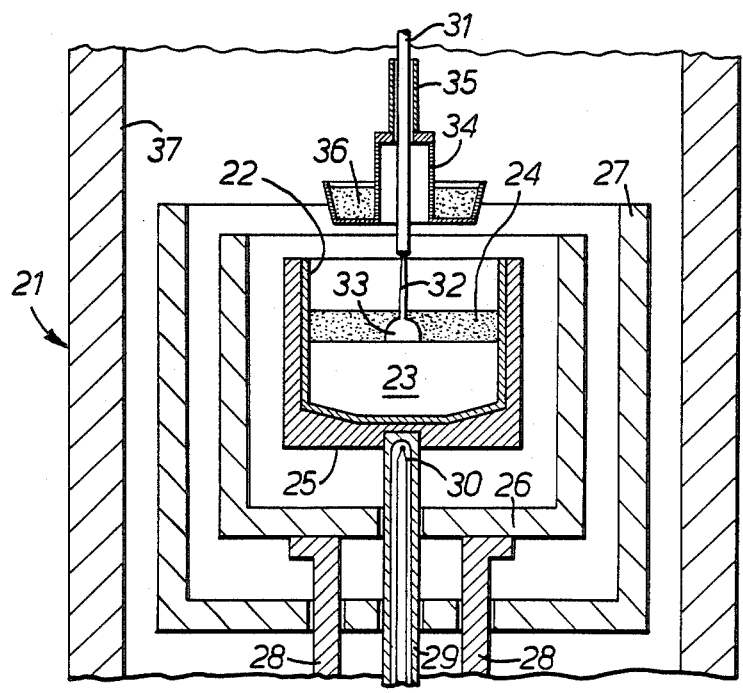
FIG. 2 shows a cross-sectional view of a main part of an apparatus constructed in accordance with the present invention for growing compound semiconductor single crystals.

In FIG. 2, the preferred embodiment of the present invention is shown and includes an apparatus 21 for growing single crystals made of compound semiconductor. Within this apparatus is a crucible 22, which contains compound semiconductor melt 23 for example, gallium phosphate (GaP), completely covered by melt boron oxide ($B_2O_3$) 24 for preventing decomposition and vaporization of the melt GaP. The crucible 22 is protected by a support wall 25. A heater 26 radiates heat to melt solid GaP and solid $B_2O_3$, and keeps and melt GaP and melt $B_2O_3$ in the molten state. The heater 26 is surrounded by a heat shield 27 to improve the heat efficiency of the heater 26 in relation to the crucible 22. A pair of conductors 28 are connected to heater 26 for applying electrical power. A crucible drive shaft 29 rotates crucible 22 to mix the melt 23 and establish uniform temperature in the melt. A thermocouple 30, which is embedded in the shaft 29, measures the temperature of the melt 23.

The apparatus 21 also has a main pulling shaft 31 having a seed crystal 32 attached at one end. The shaft 31 is connected to rotating and reciprocating apparatus (not shown) which drives the shaft at preset pulling and rotation rates to grow the GaP single crystals 33. A collector 34, which is fixed at one end of secondary pulling shaft 35 slidably mounted on the main shaft 31, removes the excess amount of the melt ($B_2O_3$) 24 from the crucible 22. Detailed explanation of the collector 34 will be presented hereafter. The apparatus 21 includes a high-pressure housing 37 whose interior chamber houses the aforedescribed structures shown in FIG. 2 and which is designed to be filled with inert gas, for example nitrogen gas ($N_2$), having a pressure higher than that of the equilibrium dissociation pressure of the semiconductor melt, here GaP.

Figure 3:
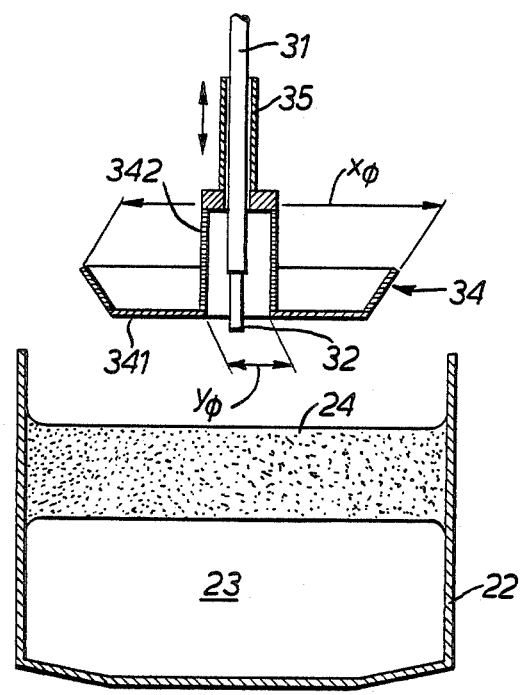
FIG. 3 shows an enlarged cross-sectional view of a pulling mechanism constructed in accordance with the present invention.

Referring to FIG. 3, the collector 34 is preferably made of silicon nitride ($Si_3N_4$) and comprises a body 341 constructed as an annular receptacle or trough for containing the excess amount of the melt $B_2O_3$. A cylinder portion 342 of the collector is connected at one end to the interior of body 341 and at the other end to secondary shaft 35. The body 341 has an outer diameter $x_\phi$ smaller than the inner diameter of the crucible 22 in order that the collector 34 is able to move up and down into and out of the crucible 22. The cylinder portion 342 has an inner diameter $y_\phi$ larger than an outer diameter of the GaP single crystals in order that the single crystals can be lifted through the cylinder portion 342.

The secondary shaft 35 is coaxially mounted on the main shaft 31 used for pulling of single crystals. The main shaft 31 and the secondary shaft 35 are hermetically sealed to the high-pressure housing 37 to prevent the leakage of $N_2$ gas. The secondary shaft 35 is also connected to a driving mechanism (not shown), which permits it to move up and down independently of the main shaft 31 as shown by the double-headed arrow in FIG. 3. In this manner, the collector 34 which is fixed to the secondary shaft 35 can be vertically moved from a desired position within the crucible 22 to a desired position above the crucible 22 and can be held at this elevated position above the crucible 22.

The operation of this preferred embodiment is explained by referring to FIGS. 4A to 4D. First, in FIG. 4A, the collector 34 has been lifted above the crucible 22. Particles of polycrystalline GaP 40 are shown as being contained in the crucible 22, the latter preferably made of quartz having a 150 mm inner diameter. The space factor (defined as the ratio of weight to volume in the crucible) of the polycrystalline GaP 40 is about 2.0 gr/cc, the weight of the polycrystalline GaP being 3.0 kg and its volume about 744 cc. At the temperature of 600° C., the 1440 gr of $B_2O_3$ particles are completely melted, but the GaP 40 is not melted.

Figure 4A:
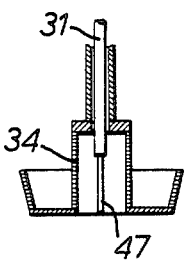
FIG. 4A to FIG. 4D are diagrams to explain the operation of the illustrative apparatus of the present invention.
Figure 4A:
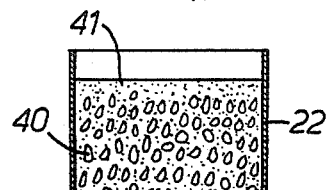

The melt ($B_2O_3$) 41 fills the spaces or interstices among the GaP particles 40 and completely covers the GaP particles 40. FIG. 4A thus shows a condition where the GaP particles 40 are dispersed among the melt ($B_2O_3$) 41 within the crucible 22.

This condition where the GaP is covered by the melt $B_2O_3$ persists even when the temperature of the GaP particles 40 is 1470° C. which is the melting point of GaP. The decomposition and the vaporization of the GaP particles 40 are thus suppressed, and the melt made of the GaP particles is not contaminated.

Figure 4B:
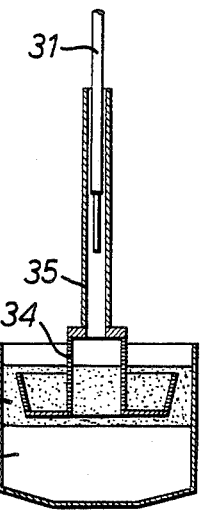

In FIG. 4B, the melt GaP 43 is shown as settled under the melt ($B_2O_3$) 41 because the specific gravity of the GaP 43 is greater than that of ($B_2O_3$) 41. The secondary shaft 35 at this time is moved downwardly independently of the main shaft 31, and the collector 34 is submerged in the melt ($B_2O_3$) 41, causing its annular trough to be filled.

Figure 4C:
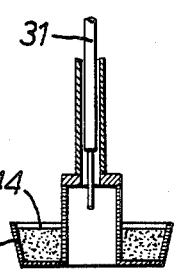
Figure 4C:
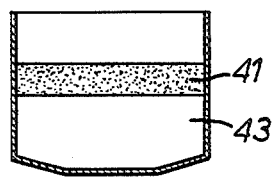

Then, as shown in FIG. 4C, secondary shaft is moved upwardly withdrawing the collector 34, and thereby removing a quantity of $B_2O_3$ melt 44, for example, 1000 gr. of the melt $B_2O_3$, from the melt $B_2O_3$ layer 41. What remains is about a 20 mm thick melt $B_2O_3$ layer 41 on the melt GaP layer 43. The reduced thickness of this melt $B_2O_3$ layer 41 does not cause deteriortion of the necessary temperature gradient at the surface of the melt GaP yet still covers the GaP melt to prevent decomposition and vaporization thereof.

Figure 4D:
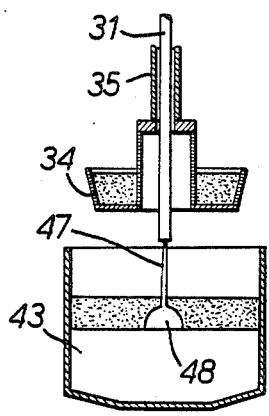

Next, as shown in FIG. 4D, the main shaft 31 moves downwardly, independently of the secondary shaft 35, so that seed crystal 47 fixed at one end of the main shaft 31 contacts the melt GaP 43. A single crystal 48 begins to grow from the seed crystal 47 and continues as the shaft 31 is pulled and rotated at the predetermined pulling and rotating rates. For example, a 2.5 kg by weight large diameter GaP single crystal with 62 mm$\phi$ diameter can be pulled at a pulling speed of 9–15 mm/H, a single crystal rotating speed of 1–10 rpm, and a crucible rotating speed of 10–30 rpm.

Another single crystal, for example, 3.0 kg by weight GaP single crystal with 75 mm$\phi$ diameter, can be successfully pulled using 3.5 kg GaP particles (ratio of weight to volume about 2.1 gr/cc) and 1500 gm $B_2O_3$ particles by removing 1050 gr $B_2O_3$. Still another single crystal, for example 2.4 kg by weight GaP single crystal with 55 mm diameter, can be successfully pulled using 3.0 kg GaP particles (ratio of weight to volume about 1.8 gr/cc) and 1600 gr $B_2O_3$ by removing 1200 g $B_2O_3$. The amount of removed $B_2O_3$ from the melt $B_2O_3$ can be changed by changing the size and thereby the interior volume of the collector 34.

The apparatus according to the invention may have a mechanism which moves the secondary shaft up and down, and rotates the shaft in order to adjust the amount of removed melt $B_2O_3$ by centrifugal force. The apparatus also has the advantage that the temperature of the single crystal may be finely controlled by rotating the collector.

What is claimed is:

1. An apparatus for growing compound semiconductor single crystals comprising:
   a crucible for containing compound semiconductor melt and inert material which does not react to the compound semiconductor melt and which is of a sufficient quantity to cover the surface of the compound semiconductor melt in order to prevent the latter from decomposition and vaporization;
   means for heating the crucible;
   means for pulling single crystals from the compound semiconductor melt, said pulling means designed to have a seed crystal attached thereto to initiate crystal growth;
   means mounted for movement independent of movement of said means for pulling single crystals for collecting a portion of melted inert material through movement into contact therewith to permit the single crystal growth yet not uncover the surface of the compound semiconductor melt; and
   a high-pressure housing in which the apparatus structural elements are contained and which is designed to be filled with inert gas under high pressure.

2. An apparatus for growing compound semiconductor single crystals according to claim 1 wherein the collecting means is coaxially positioned with reference to the crucible.

3. An apparatus for growing compound semiconductor single crystals according to claim 2 wherein the collecting means comprises a trough for holding the withdrawn inert material and designed to move up and down with reference to the crucible.

4. An apparatus for growing compound semiconductor single crystals according to claim 3 wherein the pulling means includes a shaft, and said trough has an annular shape and has a secondary shaft coaxial with the shaft of the pulling means and mounted for independent movement thereon.

5. An apparatus for growing compound semiconductor single crystals according to claim 1 wherein the collecting means comprises a trough mounted for submerging into the inert material to collect the same and then raising out of the inert material and holding the withdrawn inert material.

* * * * *